United States Patent
Sullivan et al.

(10) Patent No.: US 8,603,706 B2
(45) Date of Patent: Dec. 10, 2013

(54) FORMING A BRIDGING FEATURE USING CHROMELESS PHASE-SHIFT LITHOGRAPHY

(75) Inventors: Daniel B. Sullivan, Carver, MN (US); Sangho Kim, St. Paul, MN (US)

(73) Assignee: Seagate Technology LLC, Cupertino, CA (US)

( * ) Notice: Subject to any disclaimer, the term of this patent is extended or adjusted under 35 U.S.C. 154(b) by 153 days.

(21) Appl. No.: 13/269,086

(22) Filed: Oct. 7, 2011

(65) Prior Publication Data

US 2013/0089813 A1  Apr. 11, 2013

(51) Int. Cl.
*G03F 1/34* (2012.01)
*G03F 1/44* (2012.01)

(52) U.S. Cl.
USPC .............................................. 430/5; 430/394

(58) Field of Classification Search
USPC ................. 430/5, 311, 312, 313, 394; 355/53
See application file for complete search history.

(56) References Cited

U.S. PATENT DOCUMENTS

| | | |
|---|---|---|
| 5,273,850 A | 12/1993 | Lee et al. |
| 5,362,584 A | 11/1994 | Brock et al. |
| 5,487,962 A | 1/1996 | Rolfson |
| 5,675,164 A | 10/1997 | Brunner et al. |
| 6,541,167 B2 | 4/2003 | Petersen et al. |
| 7,354,682 B1 * | 4/2008 | Capodieci .................... 430/5 |
| 7,618,751 B2 | 11/2009 | Sandstrom et al. |
| 2006/0147813 A1 | 7/2006 | Tan et al. |
| 2006/0292455 A1 | 12/2006 | Cheng et al. |
| 2008/0160428 A1 | 7/2008 | Ha |
| 2008/0284996 A1 | 11/2008 | Lei et al. |

OTHER PUBLICATIONS

Feb. 28, 2013, File History for U.S. Appl. No. 13/268,296.
Ferguson et al., "Pattern-Dependent Correction of Mask Topography Effects for Alternating Phase-Shifting Masks", SPIE, vol. 2440, Feb. 1995, pp. 349-360.
Gordon et al.. "Design and Analysis of Manufacturable Alternating Phase-Shifting Masks", 18th Annual BACUS Symposium on Photomask Technology, 1998, 12 pages.
Liu et al., "The Application of Alternating Phase-Shifting Masks to 140 nm Gate Patterning (II): Mask Design and Manufacturing Tolerances", SPIE vol. 3334, 1998, pp. 2-14.
Ryhins et al., "Characterization of Quartz Etched PSM Masks for KrF Lithography at the 100 nm Node", 21st Annual BACUS Symposium on Photomask Technology, 2002, pp. 486-495.
Aug. 6, 2013, File History for U.S. Appl. No. 13/268,285.
Aug. 6, 2013, File History for U.S. Appl. No. 13/268,296.

* cited by examiner

*Primary Examiner* — Stephen Rosasco
(74) *Attorney, Agent, or Firm* — Hollingsworth Davis, LLC (57) ABSTRACT

First and second anchor features are formed on a substrate via a chromeless photolithography process. An elongated bridging feature is formed between the anchor features on the substrate via the chromeless photolithography process. A distance between the anchor features is sufficient to minimize lateral displacement at a center portion of the bridging feature without significant reduction in mechanical stability of the bridging feature.

20 Claims, 12 Drawing Sheets

FORMING A BRIDGING FEATURE USING CHROMELESS PHASE-SHIFT LITHOGRAPHY

CROSS-REFERENCE TO RELATED APPLICATIONS

This application is related to U.S. Publication Nos. 2013/0089753 and 2013/0089752, filed on even date herewith, the content of which is incorporated by reference in its entirety.

SUMMARY

Various embodiments described herein are generally directed to methods, systems, and apparatuses that facilitate forming features using chromeless, phase-shift lithography. In one embodiment, a method involves forming first and second anchor features are formed on a substrate via a chromeless photolithography process. An elongated bridging feature is formed between the anchor features on the substrate via the chromeless photolithography process. A distance between the anchor features is sufficient to minimize lateral displacement and ensure substantially parallel edges at a center portion of the bridging feature without significant reduction in mechanical stability of the bridging feature.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure relates generally to manufacturing techniques and processes that utilize photolithography. For example, various embodiments described below pertain to forming small scale photoresist features using chromeless photolithography masks. Photolithography is part of a process used for fabricating microscopic components (e.g., electrical circuits, optical components) that are generally made of thin films layered on a substrate. These processes may involve depositing, then selectively removing, parts of a thin film (or the substrate itself) based on a geometric pattern formed with a layer of photoresist material.

In the photolithography process, electromagnetic energy (e.g., light) is transmitted through a mask/reticle to expose parts of the photoresist layer in the desired pattern. The exposed photoresist is subjected to a chemical treatment (e.g., "developing") that removes areas of photoresist that were exposed to the light. In other cases, the areas not exposed to light may instead be removed by the developer. In either case, the resulting surface has a patterned formed by the developed photoresist, and the surface can then be further treated. For example, etching may be performed so that exposed areas of the surface are etched away, while those areas covered by the photoresist are unaffected.

Photolithography is commonly associated with the manufacture of integrated electronic circuits. Photolithography can also used in making integrated optics, which includes optical components (e.g., lasers, waveguides, lenses, mirrors, collimators, etc.) that are formed on a substrate in a manner analogous to integrated electrical circuits. In forming integrated optics, materials and shapes are chosen to have the desired optical characteristics instead of or in addition to desired electrical characteristics.

In the past few decades, the desire to make ever more densely packed integrated devices has necessitated changes to the photolithography process to form smaller individual feature sizes, often referred to by the term "minimum feature size" or "critical dimension" (CD). The CD is approximated by the formula $CD = k_1 * \lambda / NA$ where $k_1$ is a process-specific coefficient, $\lambda$ is the wavelength of applied light/energy, and NA is the numerical aperture of the optical lens as seen from the wafer.

The ability to project a usable image of a small feature onto a wafer is limited by the wavelength $\lambda$, the ability of the projection optics to capture enough diffraction orders from the illuminated mask, and the manufacturing specific variables represented by $k_1$. When features made from a binary photomask (a pattern of opaque material such as chrome overlaid on a clear substrate such as quartz) are of a certain size and/or shape, the transitions between light and dark at the edges of the projected image may not be sharply defined enough to correctly form the target photoresist features. This may result, among other things, in reducing quality of resist profiles. As a result, features 150 nm or below in size may need to utilize phase shifting to enhance the image quality at the wafer, e.g., sharpening edges of features to improve resist profiles.

Phase-shifting generally involves selectively changing phase of part of the energy passing through a mask/reticle so that the phase-shifted energy is additive or subtractive with unshifted energy at the surface of the wafer. By carefully controlling the shape, location, and phase shift angle of mask features, the resulting photoresist patterns can have more precisely defined edges. These phase shifts may be obtained in a number of ways. For example, one process known as attenuated phase shifting utilizes a layer of non-opaque material that causes light passing through the material to change in phase compared to light passing through transparent parts of the mask. Another technique is known as alternating phase shift, where the transparent mask material (e.g., quartz) is etched to different depths. The depths can be chosen to cause a desired relative phase shift in light passing through the different depths.

An alternating phase shift mask can be formed using opaque patterns in combination with phase shifting features. In other cases, what is known as a "chromeless" phase shift mask uses phase shift features alone to define the features. While a chromeless mask may forgo the use of chrome or other opaque features over the entire mask, in the present disclosure the term "chromeless mask" is intended to at least define a particular feature or set of features within the mask that relies on phase shift alone to define a photoresist feature. In such a case, the chromeless mask may use opaque/binary features elsewhere, either with or without phase shifting features.

In reference now to FIG. 1A, a diagram illustrates an example photoresist feature 100, which is a desired shape resulting from light being projected on a wafer through a mask as discussed in detail hereinbelow. The photoresist feature 100 generally includes first and second anchors 102, which in this example are triangular shapes. A bridge 104 is generally an elongated, straight line running from center points of the anchors 102. No other mechanical supporting structures are coupled to the bridge 104 between the anchors. The features 102, 104 may be used to ensure that material is deposited in a region of interest 106 having a specified dimension and location. For example, the anchors 104 may provide mechanical support to the bridge portion 106 during processing. After creation and treatment of the photoresist feature 100 (e.g., exposure, development, etching), parts of the feature 100 outside the region of interest 106 may be later removed, e.g., through processes such as chemical mechanical polishing/planarization (CMP).

In one example, this region of interest 106 may define a generally rectangular magnetoresistive stack of a hard drive reader/writer head. However, it will be appreciated that a photoresist feature such as feature 100 may be used in forming any related electrical or optical component. For example, any optical or electrical component of conventional and heat assisted recording read/write heads may be formed using a feature similar to feature 100 and parts thereof, including write poles, shields, waveguides, near-field transducers, mirrors, collimators, heaters, etc.

In embodiments described below, the span length 107 of the bridge 104 is on the order of 0.50 µm, and the CD of the region of interest (e.g., width 109) is on the order of 50 nm (e.g., between 30 nm to 60 nm). Accordingly, the span 107 of the bridge is an order of magnitude greater than (e.g., ten times or more than) the width 109 of the span. Although the order of magnitude of these dimensions may have some relevancy to the concepts described herein, it will be appreciated that the embodiments described herein are not intended to only be limited to these values/ranges unless otherwise stated.

Figure 1A:
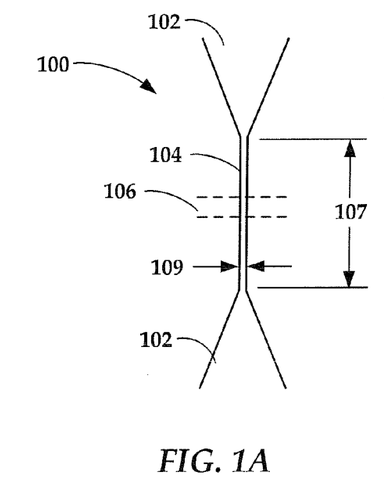
FIG. 1A is an aerial/plan view of a photoresist feature according to an example embodiment.
Figure 1B:
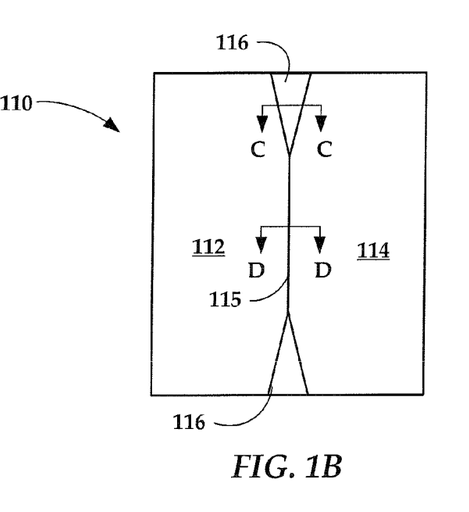
FIG. 1B is an aerial/plan view of a mask according to an example embodiment.

In FIG. 1B, an aerial/plan view shows a mask 110 usable to make the feature 100 shown in FIG. 1A. The anchors 102 are formed by anchor features 116 on the mask 110. The bridging feature 104 of FIG. 1A is formed by transition 115 between regions 112, 114. The anchor features 116 may use an opaque overlay (e.g., chrome) along with a transition between regions 112, 114, but the bridging transition 115 is at least chromeless. Cross sections C-C and D-D of the mask 110 according to an example embodiment are shown in FIGS. 1C and 1D, respectively.

Figure 1C:
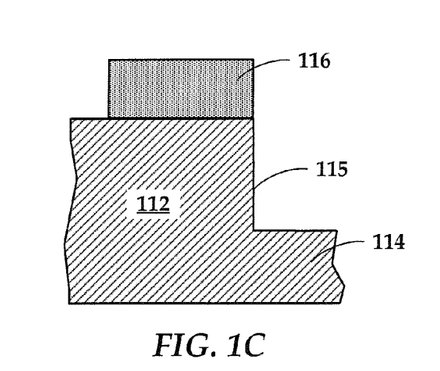
FIGS. 1C and 1D are cross section views corresponding to section lines C-C and D-D, respectively, of the mask shown in FIG. 1B.
Figure 1D:
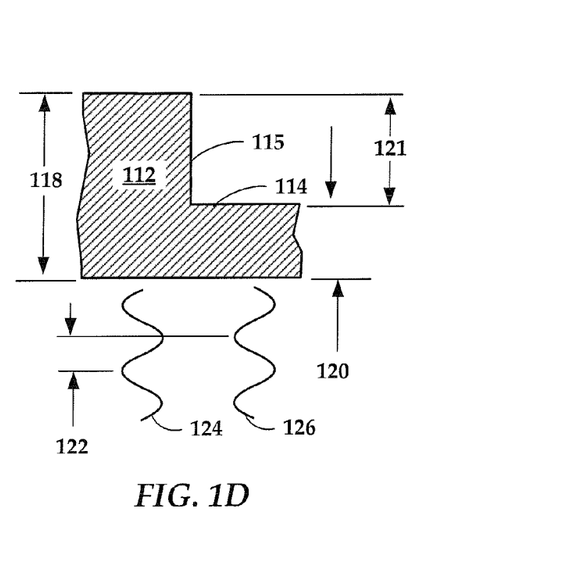

As seen in FIG. 1C, feature 116 is defined by a chrome layer, and one edge of transition 115 may also form part of feature 116 at this location. It can be seen in FIG. 1D seen that there is no chrome overlay along the middle of transition 115 (e.g., at or near area of interest 106), and the transition 115 alone forms the bridge 104 of the photoresist feature 100. Also seen in FIG. 1D, thicknesses 118, 120 of respective portions 112, 114 are different, due to etching by depth 121. This depth difference 121 causes light 124 passing through portion 112 to be phase shifted 122 relative to light 126 passing through portion 114. The amount of phase shift 122 can be adjusted by changing the relative size of these dimensions 118, 120.

Figure 2A:
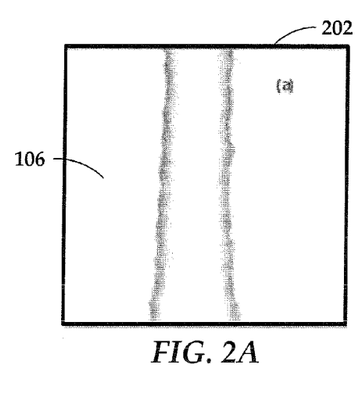
FIGS. 2A and 2B are scanning electron microscope images of a photoresist feature according to an example embodiment.
Figure 2B:
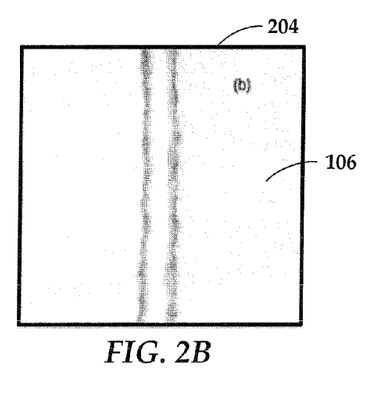

A number of sample photoresist features were formed using a 0.5 um span length. As shown in FIG. 2A, a scanning electron microscope (SEM) measurement image 202 shows how the area of interest 106 in some samples can exhibit a flare angle due to misalignment and/or optical proximity effects from the anchor feature of the mask (e.g., anchor feature 116 seen in FIG. 1B). In FIG. 2B, an SEM image 204 show the desired image shape of the area of interest, with generally parallel sides. Also of note is that the flaring seen in images 202 may affect control over width of the feature of interest, e.g., make that difficult to maintain consistency in that dimension.

These features are also prone to bending and/or displacement in the middle portion of the span, e.g., near region 106 seen in FIG. 1A. This bending/displacement may be due to misalignment and/or proximity effects of the anchor features 116 of the mask 110 shown in FIG. 1B. For example, the anchor feature of the mask may be formed using an opaque material, and this may result in optical effects that can affect both the shape of the area of interest 106, as well as its location, e.g., relative to anchor portion 102 of the photoresist feature 100. Similar optical effects may also be experienced using a chromeless anchor feature For example, in FIG. 2C, a series of graphs illustrates simulation results of the photoresist features produced using various span lengths (e.g., span 107 of photoresist feature 100 shown FIG. 1A). In this and the following example, the span lengths are varied from 350 nm to 700 nm in 50 nm steps. In FIG. 3, a graph summarizes the data points of FIG. 2C, together with a linear fit of the data points. The results show that this type of photoresist feature may include in a lateral displacement of the feature near the center of the span (e.g., region 106 in FIG. 1A). This effect is reduced as the span length 107 is increased.

Figure 2C:
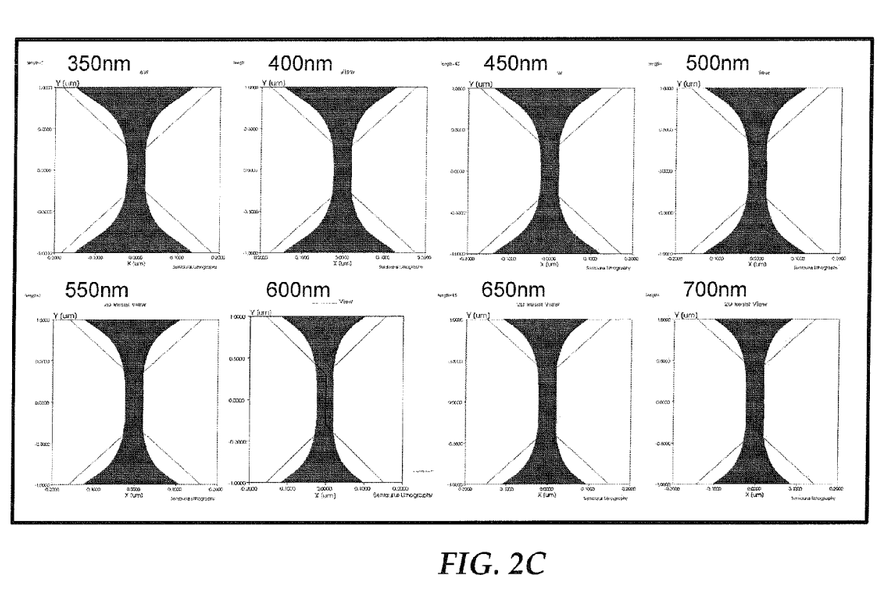
FIG. 2C is a series of graphs illustrating simulation results of photoresist features produced using various span lengths according to example embodiments.
Figure 3:
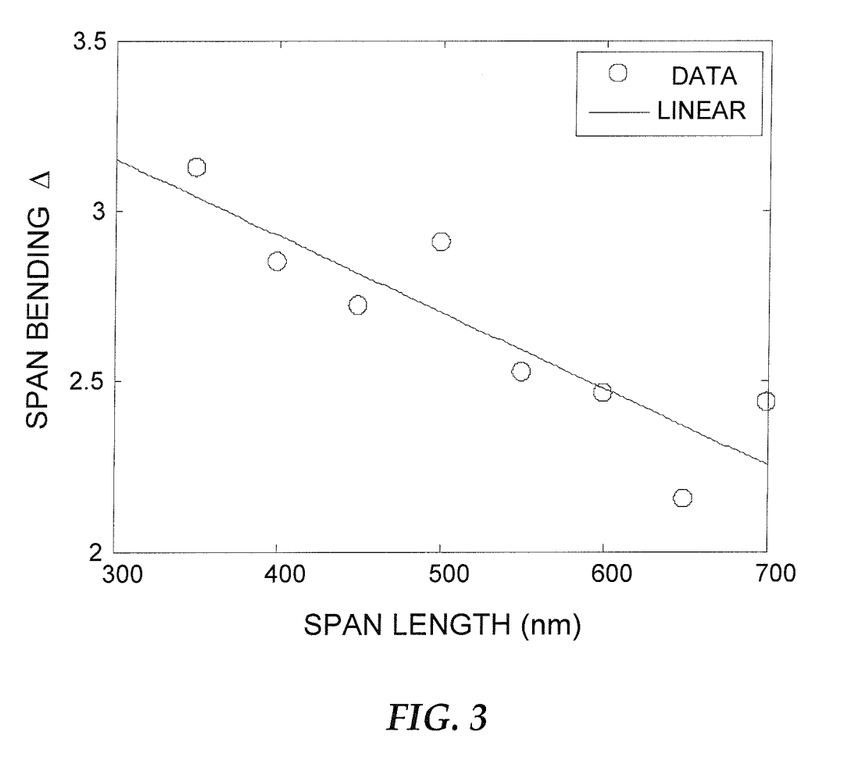
FIG. 3 is a graph summarizing the data points of FIG. 2C.
Figure 4:
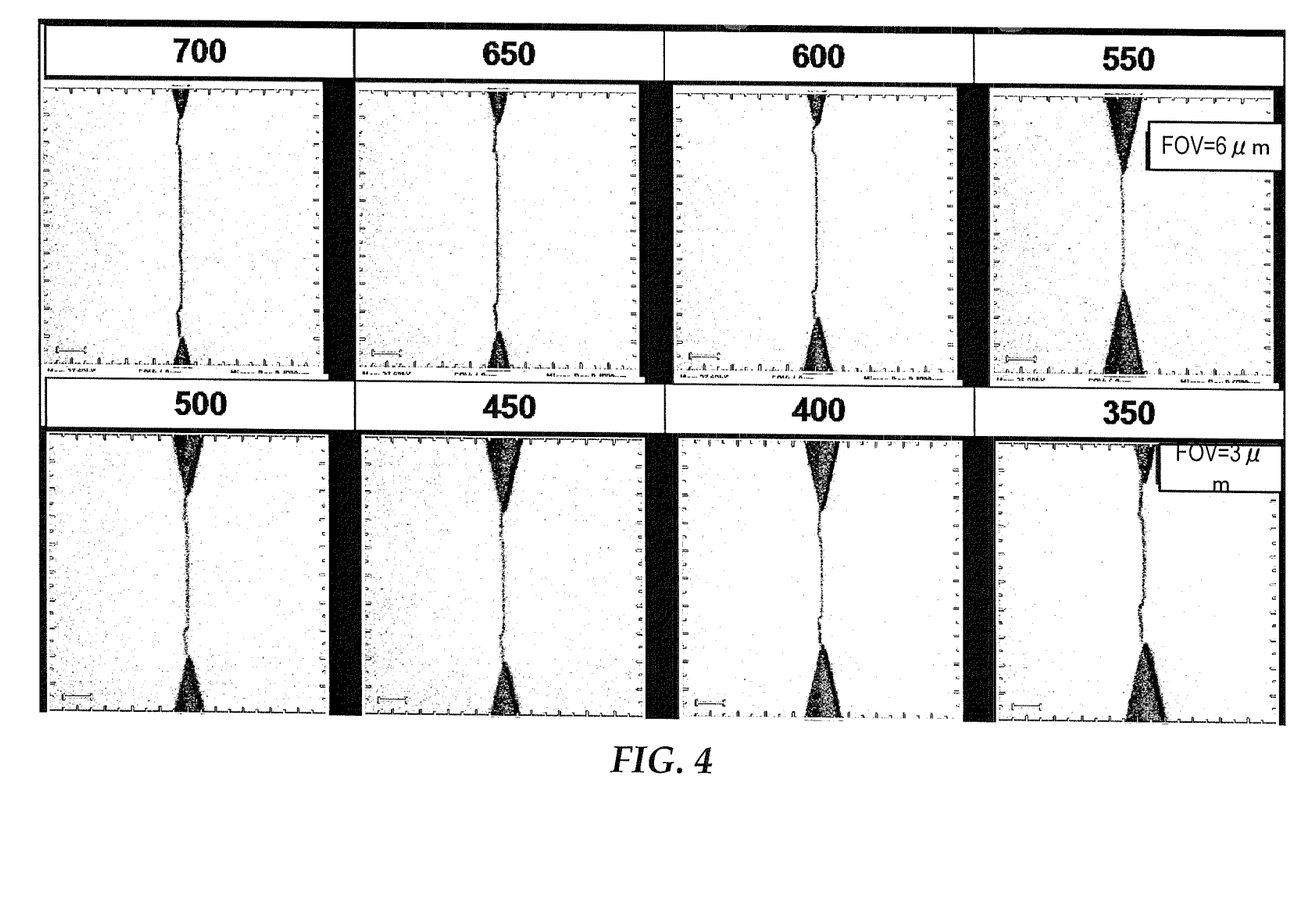
FIG. 4 is a series of SEM images showing photomask patterns fabricated using differing span dimensions according to example embodiments.
Figure 5:
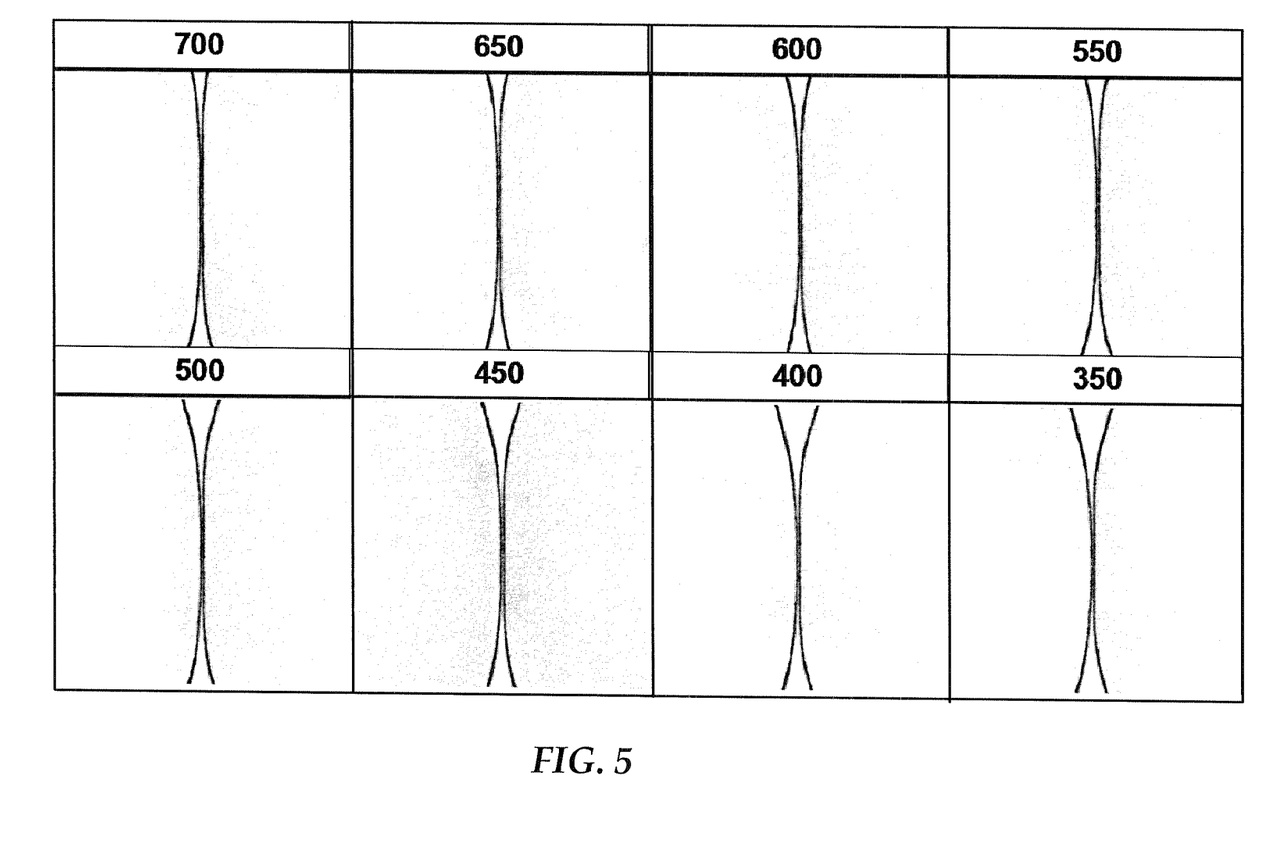
FIG. 5 is a series of SEM images showing the results of the masks of FIG. 4 being used to form pattern photoresist on a wafer according to an example embodiment.
Figure 6A:
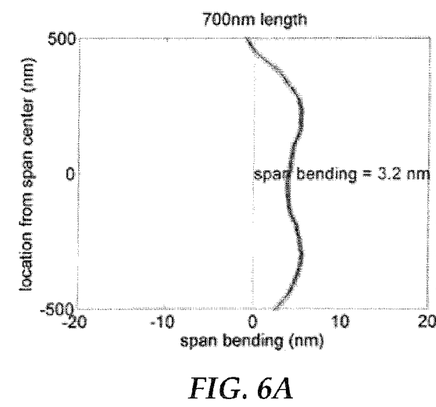
FIGS. 6A-6D and 7A-7D are graphs illustrating image analysis of the SEM images of FIG. 5.
Figure 6B:
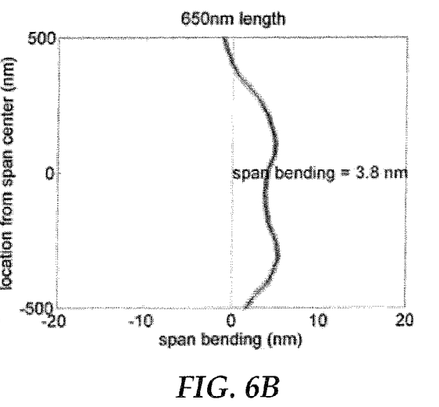
Figure 6C:
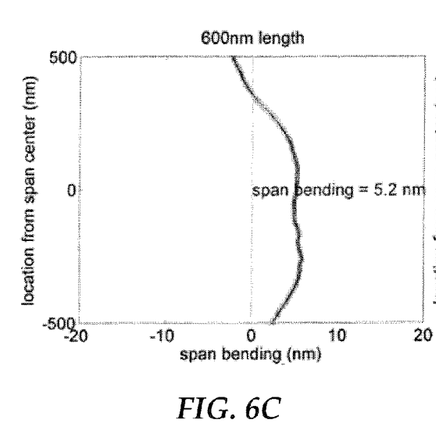
Figure 6D:
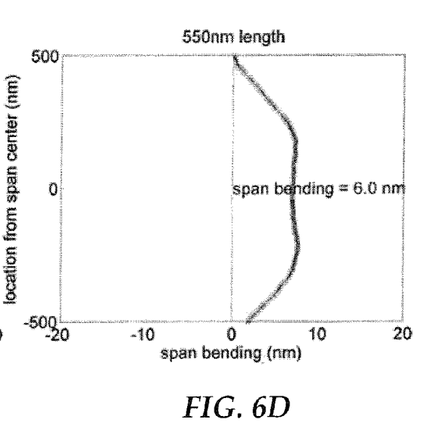
Figure 7A:
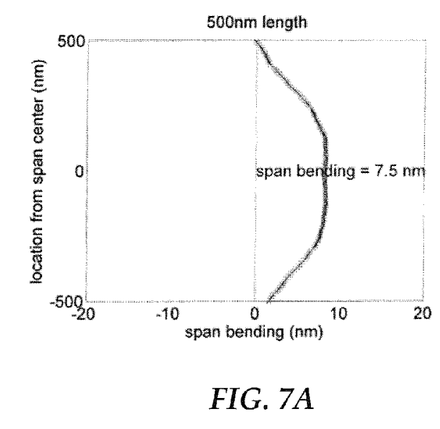
Figure 7B:
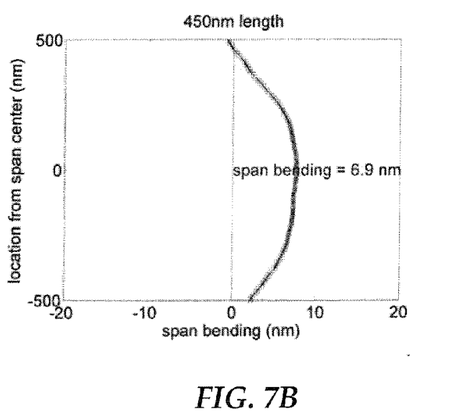
Figure 7C:
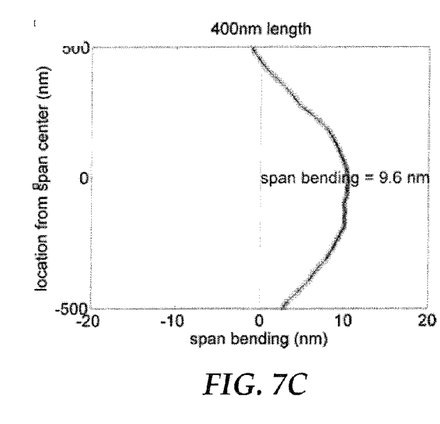
Figure 7D:
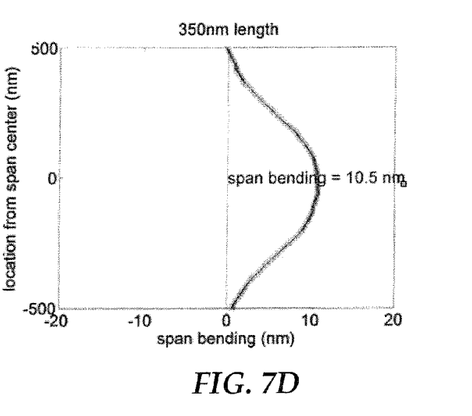
Figure 8:
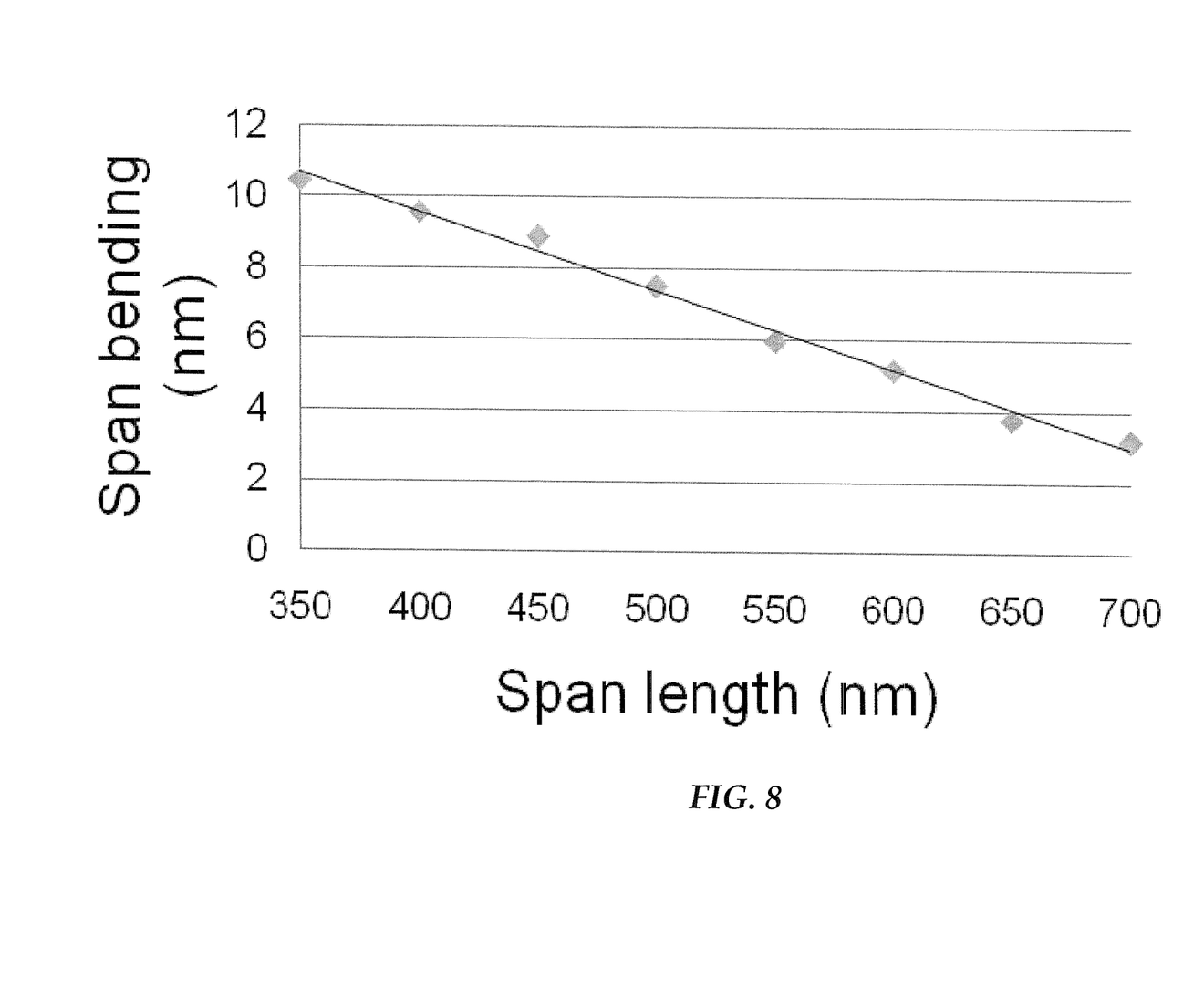
FIG. 8 is a chart summarizing the results of FIGS. 6A-6D and 7A-7D.

In FIG. 4, a series of SEM images shows photomask patterns (e.g., pattern 110 as shown in FIG. 1B) fabricated using differing span dimensions similar to the simulation of FIGS. 2C and 3. In FIG. 5, a series of SEM images shows the results of the masks of FIG. 4 being used to pattern photoresist on a wafer. Image analysis of the SEM images of FIG. 5 was performed to determine lateral location of the area of interest (e.g., region 106 in FIG. 1A), the result of which are shown in FIGS. 6A-6D and 7A-7D. In FIG. 8, a chart summarizes the results of 6A-6D and 7A-7D.

These figures illustrate how the span bending can be reduced by increasing the span length. It was also considered whether longer span length could cause issues with mechanical stability of the resultant features, e.g., due to factors such as the nature of the thin beam structure and residual stresses of the thin films upon which the features are formed.

Figure 9A:
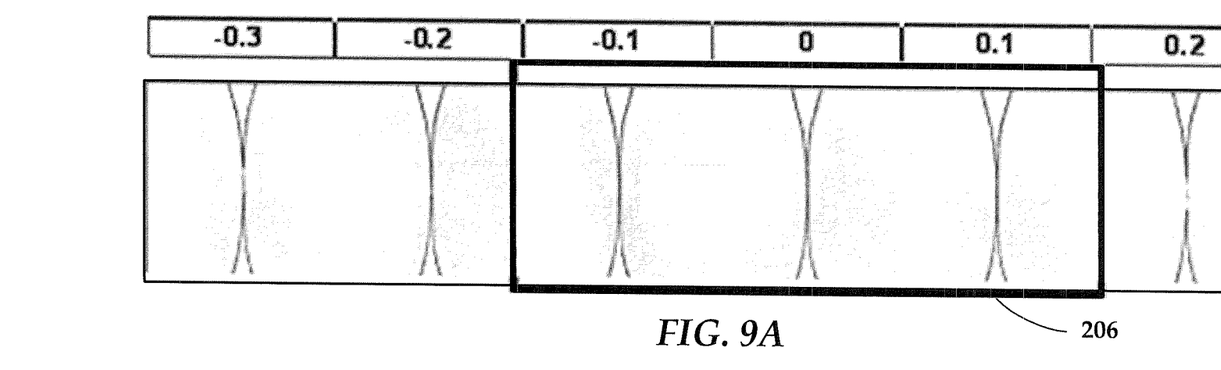
FIGS. 9A and 9B are scanning electron microscope images at various defocus conditions (measured in microns) of photoresist features formed with 350 nm and 700 nm nominal span lengths, respectively, according to example embodiments.
Figure 9B:
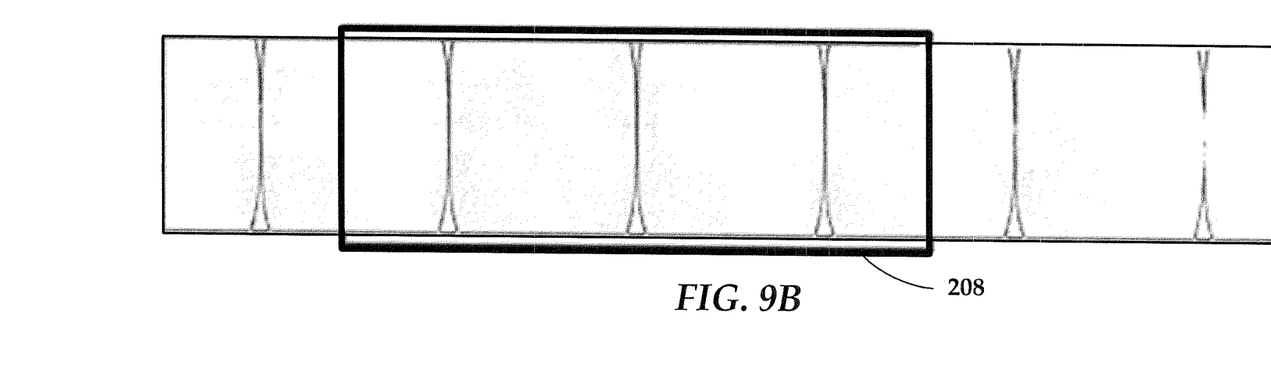

In FIGS. 9A and 9B, a series of SEM images shows the results of forming test features across various defocus conditions according to example embodiments with two different span lengths. In FIG. 9A, the nominal span length is 350 nm, and in FIG. 9B the nominal span length is 700 nm. While both examples exhibited breakages, the number of features that were unbroken (highlighted by outlines 206 and 208) were the same between the two span lengths thus showing they have similar process windows. Although it is possible that the span length cannot be increased indefinitely without impacting mechanical stability, over the range of span lengths discussed herein there is no measurable loss of mechanical stability.

Although increasing span length 107 decreases span bending/offset without significant decrease in mechanical stability, additional measures may be taken to ensure greater dimensional reliability in forming features such as those described here. One example of these measures is described in related U.S. patent application Ser. No. 13/268,285, filed on the same date herewith, which is hereby incorporated by reference in its entirety. In that related application, a mask feature (e.g., feature 115 in FIG. 1B) used to form the bridge is offset relative to the center points of anchor features 116. In such an arrangement, the offset may help overcome localized bending along the bridging feature 104, e.g., proximate the anchor features 102 or elsewhere. This reduction in bending may also help to ensure mechanical stability and/or more accurate placement of features in the region of interest.

Figure 10:
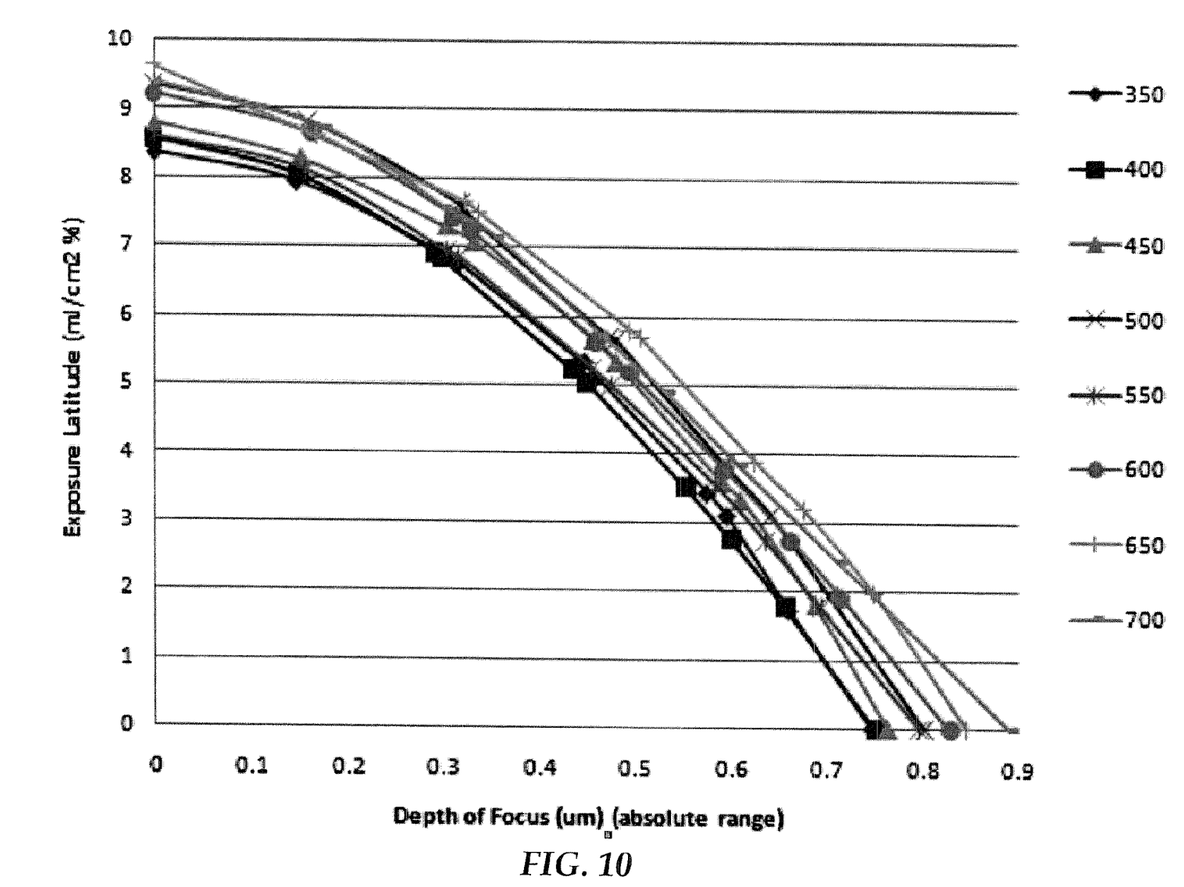
FIG. 10 is a depth-of-focus/exposure latitude graph illustrating process sensitivity of increasing bridging feature span length according to example embodiments.
Figure 11:
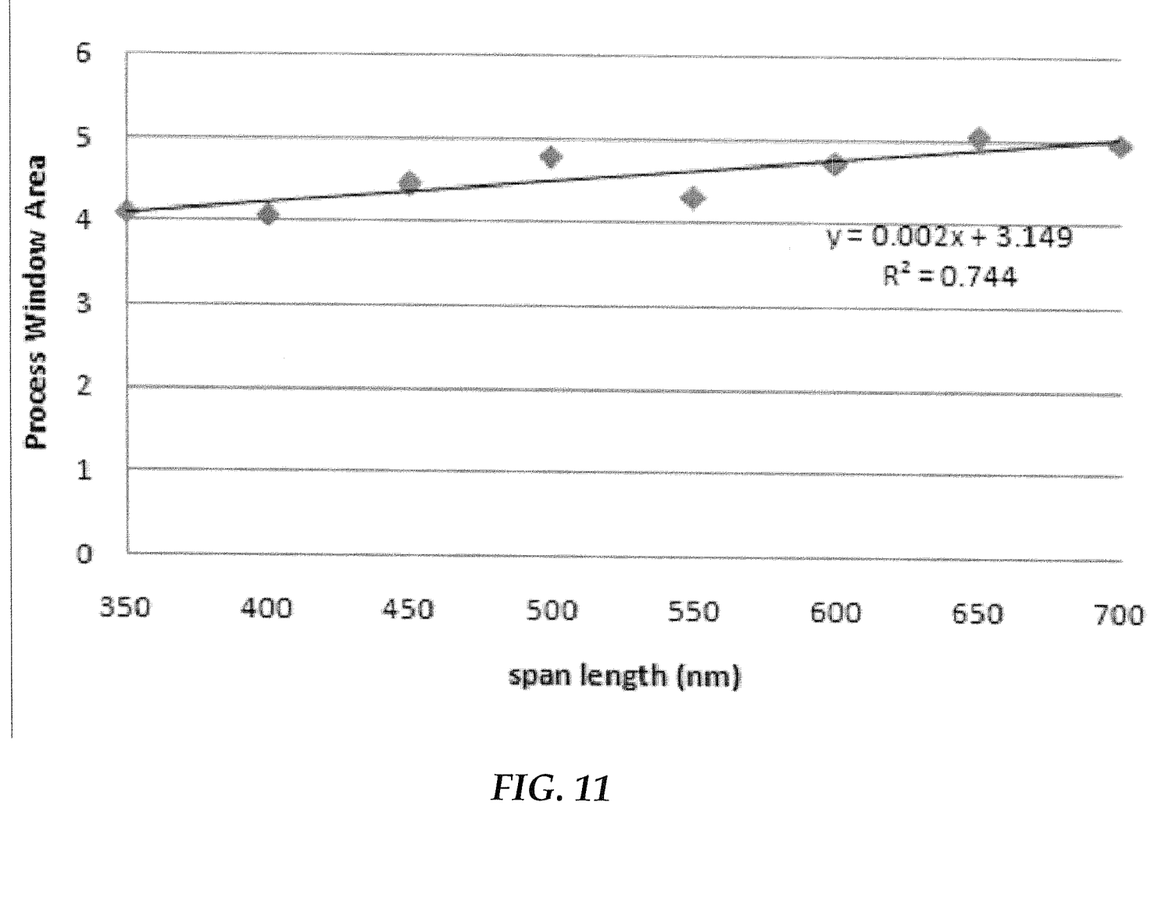
FIG. 11 is a graph comparing experimental and simulated process window areas for bridging features according to example embodiments.

It was also considered whether increasing of the span length 107 affects the process windows, e.g., affect manufacturing yields of photolithography manufactured devices. As shown in FIGS. 10 and 11, changes in span length appear to modestly improve the process window. In FIG. 10, a depth-of-focus/exposure latitude graph illustrates the process sensitivity of increasing bridging feature span length according to example embodiments. In FIG. 11 a comparison of experimental process window areas is shown for a span bridging feature according to example embodiments. The experimental results in FIGS. 10 and 11 show a modest trend of improvement as span lengths increase from 350 nm to 700 nm.

Figure 12:
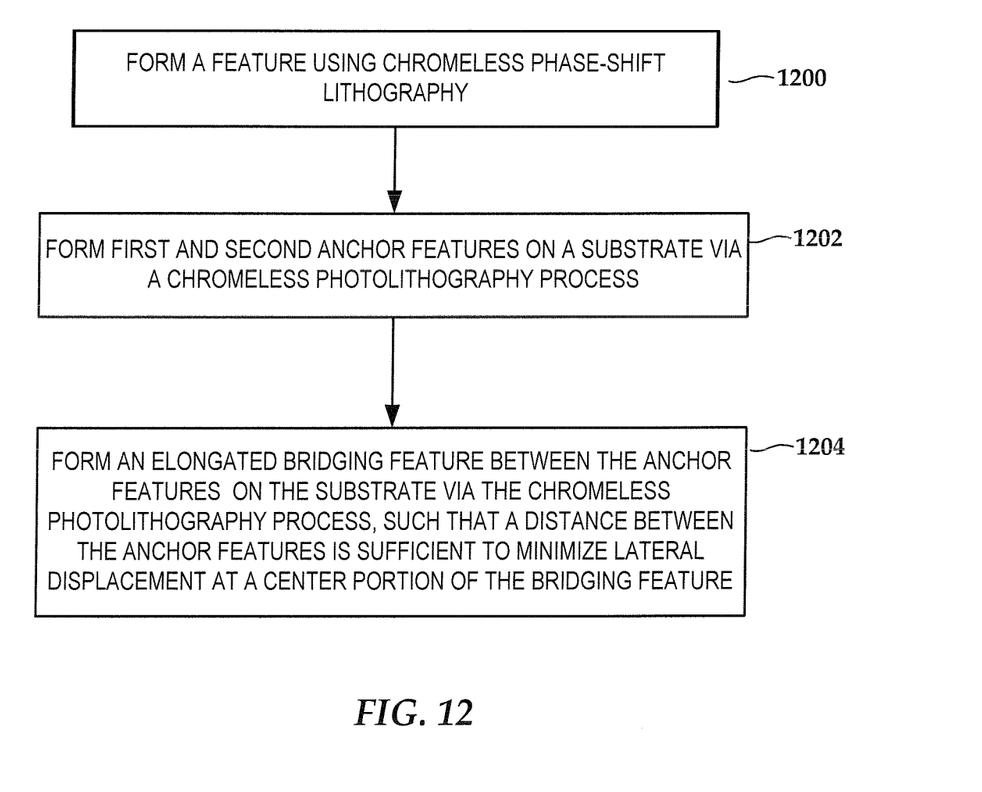
FIG. 12 is a flowchart illustrating a procedure according to an example embodiment.

In reference now to FIG. 12, a flowchart illustrates a procedure 1200 according to an example embodiment. First and second anchor features are formed 1202 on a substrate via a chromeless photolithography process. The first and second anchor features may be formed via an opaque masking material on a photolithography mask. In such a case, the distance between the anchor features alleviates optical effects on the portion of the bridging photoresist feature caused by the anchor features. Further in this case, the alleviation of optical effects may ensure substantially parallel edges at the portion of the corresponding bridging photoresist feature.

An elongated bridging feature is formed 1204 between the anchor features on the substrate via the chromeless photolithography process. A distance between the anchor features is selected to minimize lateral displacement at a center portion of the bridging feature. This distance may also be selected to ensure substantially parallel edges at a center portion of the bridging feature, minimize bending of the bridging feature, and cause no measurable loss of mechanical stability of the bridging feature. For example, the distance between the anchor features may be at least ten times greater than a width of the bridging feature. In another example, the width of the bridging feature may be between 30 nm and 50 nm, and in such a case, the distance between the anchor features may be at least 500 nm. The center portion of the bridging feature may be used to form a magnetic read/write head.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
   forming first and second anchor features on a substrate via a chromeless photolithography process;
   forming an elongated bridging feature between the anchor features on the substrate via the chromeless photolithography process, wherein a distance between the anchor features is sufficient to minimize lateral displacement at a center portion of the bridging feature without significant reduction in mechanical stability of the bridging feature; and
   forming a magnetic read/write head using the center portion of the bridging feature.

2. The method of claim 1, wherein the first and second anchor features are formed via an opaque masking material on a photolithography mask.

3. The method of claim 1, wherein the distance between the anchor features alleviates optical effects caused by features of a photolithography mask used to form the anchor features, and wherein the alleviation of optical effects minimizes the lateral displacement of the center portion of the bridging feature.

4. The method of claim 1, wherein the distance between the anchor features is at least ten times greater than a width of the bridging feature.

5. The method of claim 4, wherein the width of the bridging feature is between 30 nm and 50 nm, and wherein the distance between the anchor features is at least 500 nm.

6. The method of claim 1, wherein the distance between the anchor features is selected to improve a lithographic process window associated with forming the bridging feature.

7. The method of claim 1, wherein minimizing the lateral displacement at the center portion of the bridging feature comprises minimizing bending at the center portion.

8. The method of claim 1, wherein forming the magnetic read/write head comprises removing the first and second anchor features and a portion of the elongated bridging feature outside the center portion.

9. An apparatus comprising:
   a substrate;
   first and second anchor features formed on the substrate via chromeless photolithography; and
   an elongated bridging feature extending between the anchor features formed on the substrate via chromeless photolithography, wherein a distance between the anchor features is sufficient to minimize lateral displacement at a center portion of the bridging feature without significant reduction in mechanical stability of the bridging feature, the center portion of the bridging feature being used to form a magnetic read/write head on the substrate.

10. The apparatus of claim 9, wherein the distance between the anchor features alleviates optical effects caused by features of a photolithography mask used to form the anchor features, and wherein the alleviation of optical effects minimizes the lateral displacement of the center portion of the bridging feature.

11. The apparatus of claim 9, wherein the distance between the anchor features is at least ten times greater than a width of the bridging feature.

12. The apparatus of claim 11, wherein the width of the bridging feature is between 30 nm and 50 nm, and wherein the distance between the anchor features is at least 500 nm.

13. The apparatus of claim 9, wherein the distance between the anchor features is selected to improve a lithographic process window associated with forming the bridging feature.

14. The apparatus of claim 9, wherein minimizing the lateral displacement at the center portion of the bridging feature comprises minimizing bending at the center portion.

15. A photolithography mask comprising:
first and second anchor features; and
an elongated, chromeless, bridging feature extending between the anchor features, wherein a distance between the anchor features is sufficient to minimize lateral displacement at a center portion of a corresponding bridging photoresist feature formed by the bridging feature without significant reduction in mechanical stability of the corresponding bridging photoresist feature, the center portion of the bridging feature used to form a magnetic read/write head.

16. The photolithography mask of claim 15, wherein the first and second anchor features are formed via an opaque masking material on the photolithography mask.

17. The photolithography mask of claim 15, wherein the distance between the anchor features alleviates optical effects caused by the anchor features, and wherein the alleviation of optical effects minimizes the lateral displacement of the center portion of corresponding bridging photoresist feature.

18. The photolithography mask of claim 15, wherein the distance between the anchor features is at least ten times greater than a width of the bridging feature.

19. The photolithography mask of claim 18, wherein the width of the bridging feature is between 30 nm and 50 nm.

20. The photolithography mask of claim 19, wherein the distance between the anchor features is at least 500 nm.

* * * * *